United States Patent [19]

Nakano et al.

[11] Patent Number: 5,341,325
[45] Date of Patent: Aug. 23, 1994

[54] FERROELECTRIC MEMORY DEVICE WITH CROSSTALK PROTECTION IN READING/WRITING OPERATION

[75] Inventors: Hiroshi Nakano; Yasuo Isono, both of Tokyo, Japan

[73] Assignee: Olympus Optical Co., Ltd., Tokyo, Japan

[21] Appl. No.: 971,947

[22] Filed: Nov. 5, 1992

[30] Foreign Application Priority Data

Aug. 6, 1992 [JP] Japan .................................. 4-210470

[51] Int. Cl.$^5$ .............................................. G11C 11/22
[52] U.S. Cl. ..................................... 365/145; 365/149; 365/175; 365/210
[58] Field of Search ................. 365/145, 149, 115, 174, 365/175, 210

[56] References Cited

U.S. PATENT DOCUMENTS

| | | | |
|---|---|---|---|
| 2,695,397 | 11/1954 | Anderson | 365/145 |
| 3,540,011 | 11/1970 | Stupp et al. | 365/115 |
| 4,110,839 | 8/1978 | Bert et al. | 365/174 |
| 4,920,513 | 4/1990 | Takeshita et al. | 365/175 |
| 5,019,530 | 5/1991 | Kleinsasser et al. | 257/475 |
| 5,063,539 | 11/1991 | Rallapalli | 365/145 |
| 5,086,412 | 2/1992 | Jaffe et al. | 365/145 |

FOREIGN PATENT DOCUMENTS

| | | |
|---|---|---|
| 3-108192 | 5/1991 | Japan . |
| 3-108769 | 5/1991 | Japan . |
| 4-18753 | 1/1992 | Japan . |

*Primary Examiner*—Eugene R. LaRoche
*Assistant Examiner*—Christopher R. Glembocki
*Attorney, Agent, or Firm*—Frishauf, Holtz, Goodman & Woodward

[57] ABSTRACT

A plurality of memory cells are constituted by a large number of belt-like first conductive members, a ferroelectric thin film formed on the first conductive members, and a large number of belt-like second conductive members formed on the film in a direction perpendicular to the first conductive members. A reading/writing section performs a reading/writing operation with respect to each memory cell after applying a predetermined voltage to at least memory cells other than a target memory cell to cause ferroelectric polarization corresponding to crosstalk components. A two-terminal switch integrally stacked on each of the memory cells serves to reduce dielectric polarization for the elimination of crosstalk caused in each memory cell.

14 Claims, 7 Drawing Sheets

FERROELECTRIC MEMORY DEVICE WITH CROSSTALK PROTECTION IN READING/WRITING OPERATION

BACKGROUND OF THE INVENTION

1. Field of the Invention

The present invention generally relates to a semiconductor memory device and, more particularly, to a ferroelectric memory device using a ferroelectric member as a capacitive element.

2. Description of the Related Art

In general, a ferroelectric memory device is a memory device using a ferroelectric thin film as a capacitive element. One of such ferroelectric memory devices is designed on the basis of the fact that the dielectric constant of a ferroelectric material is much larger (about fifty to several hundreds times) than that of a dielectric material such as $SiO_2$ generally used for a semiconductor device. That is, a ferroelectric thin film is used as a shadow capacitor of a conventional dynamic random access memory (DRAM) to achieve a higher integration density than the conventional memory.

In addition, a ferroelectric memory device is used as a nonvolatile memory based on ferroelectric polarization caused in a ferroelectric member. This nonvolatile memory is based on the characteristic of a ferroelectric member that once an external electric field is applied, it retains polarization (ferroelectric polarization) after the external electric field ceases to be applied unless an electric field is applied in the reverse direction.

In addition, since the reversing speed of the polarization of the ferroelectric member is high, it is expected that the speed of writing data in the memory using the ferroelectric member can be increased as compared with an electrically erasable programmable read-only memory (EEPROM) and the like which are widely used nowadays. Therefore, it is expected that ferroelectric memory devices are used as erasable nonvolatile memory devices including magnetic disks and the like.

Furthermore, since data stored in a ferroelectric memory device is not influenced by cosmic rays which externally enter the device, the reliability of the ferroelectric memory device is higher than that of a conventional semiconductor memory.

Figure 17:
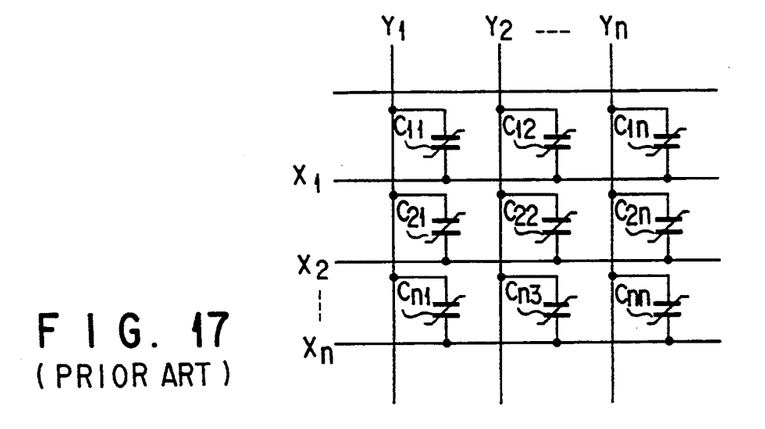
FIG. 17 is a circuit diagram showing the arrangement of a conventional simple matrix memory device in which ferroelectric memory cells are arranged in the form of a matrix.

As such a ferroelectric memory device, a conventional device having the following structure is known. As shown in FIG. 17, ferroelectric capacitors, each constituted by a ferroelectric film and electrodes formed to sandwich the film, are arranged in a matrix so as to form a large number of orthogonal belt-like electrodes $X_1, X_2, \ldots, X_n$, and $Y_1, Y_2, \ldots, Y_n$. In this case, the respective electrodes are capacitively coupled through the ferroelectric films. As a result, memory cells $C_{11}, C_{12}, \ldots, C_{nn}$ constituted by the ferroelectric capacitors are formed at the intersections between the respective X and Y electrodes. A memory device having such a structure is called a simple matrix memory device using a ferroelectric material.

Figure 3:
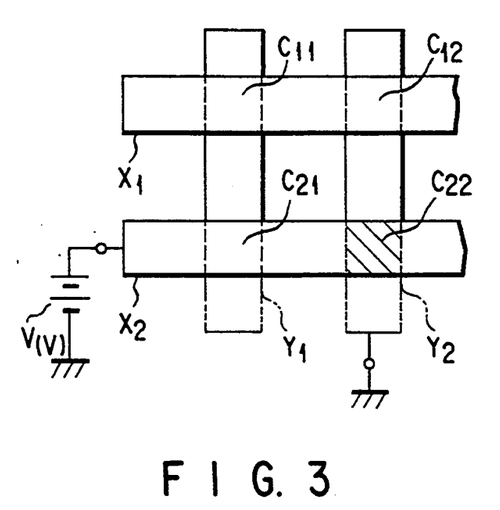
FIG. 3 is a view showing the detailed arrangement of a part of a simple matrix arrangement in FIG. 16.

However, in the simple matrix memory device, when, for example, a voltage is applied to the memory cell $C_{11}$ selected by the electrodes $X_1$ and $Y_1$ shown in FIG. 3, the voltage is applied to not only the memory cell $C_{11}$ but also the memory cells $C_{12}$ and $C_{21}$ as nonselected cells.

When, therefore, a voltage is applied to the memory cell $C_{11}$ to read out information recorded therein, part of information recorded in the memory cells $C_{12}$ and $C_{21}$ is also read out. As a result, an error is caused in the information from the memory cell $C_{11}$. Similarly, in a writing operation, when information is written in the memory cell $C_{11}$, part of the information is also written in the memory cells $C_{12}$ and $C_{21}$.

Such a phenomenon is called "crosstalk". The amount of crosstalk caused is increased with an increase in the size of a matrix arrangement. Consequently, information to be read or written may be mixed with crosstalk components.

Figure 18:
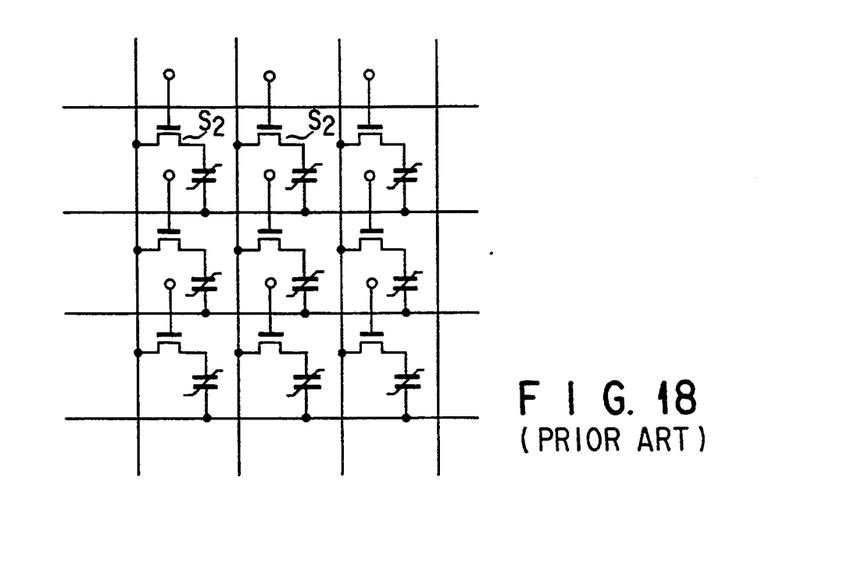
FIG. 18 is a circuit diagram showing the arrangement of a conventional active matrix memory device.

For this reason, a memory arrangement called an active matrix is generally used, in which a three-terminal switch constituted by a MOS transistor or the like and designed for crosstalk protection is formed for each memory cell, as shown in FIG. 18.

In this active matrix arrangement, however, since a switch controlled by an external signal is added to each memory cell, the stacked structure is complicated. In addition, control lines for controlling switching of the memory cells are required, hindering the realization of a high-density structure.

SUMMARY OF THE INVENTION

It is, therefore, an object of the present invention to provide a new and improved ferroelectric memory device in which ferroelectric memory cells, each having a simple structure including a two-terminal switch, are arranged in a matrix, and crosstalk can be prevented.

It is another object of the present invention to provide a ferroelectric memory device which can prevent crosstalk, has a high S/N ratio, and can realize a high integration density.

In order to achieve the above objects, according to the first aspect of the present invention, there is provided a ferroelectric memory device comprising a plurality of memory cells constituted by a large number of belt-like first conductive members, a ferroelectric thin film formed on the first conductive members, and a large number of belt-like second conductive members formed on the film in a direction perpendicular to the first conductive members, and means for performing a reading/writing operation with respect to each of the plurality of memory cells after applying a predetermined voltage to at least memory cells other than a memory cell for which the reading/writing operation is performed.

In the ferroelectric memory device according to the first aspect of the present invention, a reading/writing operation with respect to each memory cell is performed after a predetermined voltage is applied to memory cells other than a target memory cell to cause ferroelectric polarization corresponding to crosstalk components.

In addition, in order to achieve the above objects, according to the second aspect of the present invention, there is provided a ferroelectric memory device comprising memory cell means constituted by a matrix of memory cells, each constituted by a series circuit of a two-terminal switch constituted by either an MIM tunnel switch having a three-layer structure consisting of a metal layer (M), an insulating layer (I), and a metal layer (M), or a bidirectional diode, and a ferroelectric capacitor having ferroelectric characteristics, X/Y address means for selecting a desired memory cell of the memory cell means, and means for performing a reading/writing operation with respect to the memory cell selected by the X/Y address means after applying a predetermined voltage to all the memory cells.

In the ferroelectric memory device according to the second aspect of the present invention, a reading/writing operation with respect to each memory cell is performed after a predetermined voltage is applied to memory cells other than a target memory cell to cause ferroelectric polarization corresponding to crosstalk components, thereby eliminating the influence of crosstalk. In addition, by adding a nonlinear two-terminal switch to each ferroelectric memory cell, ferroelectric polarization caused upon elimination of crosstalk components can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

Figure 1:
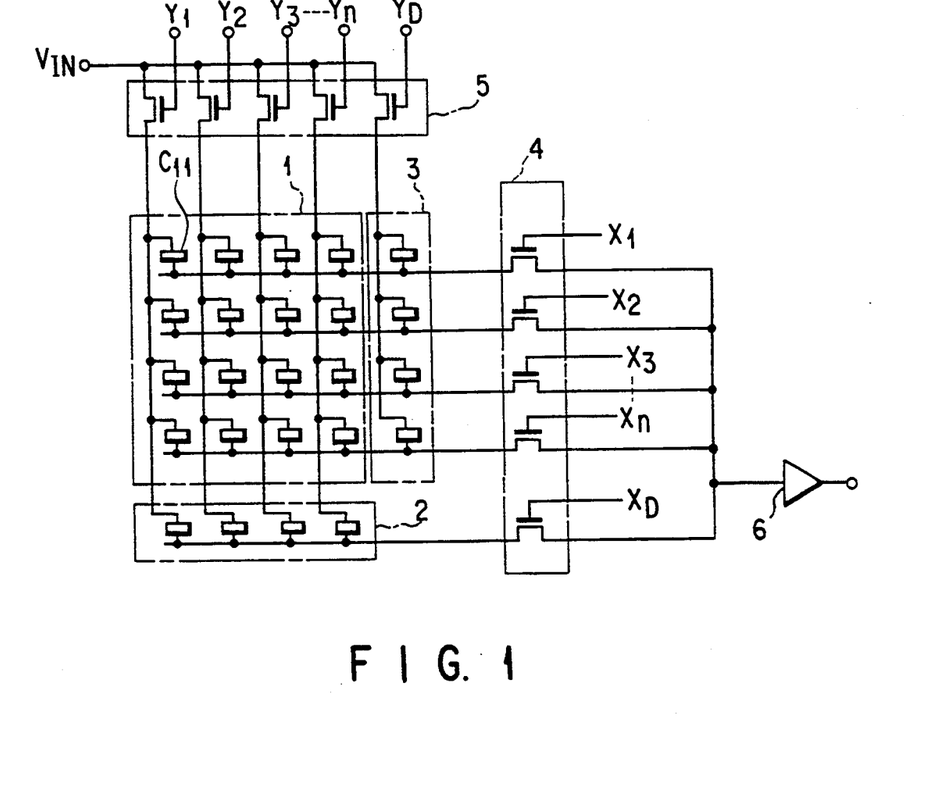
FIG. 1 is a circuit diagram showing the arrangement of a ferroelectric memory device according to the first embodiment of the present invention.
Figure 2A:
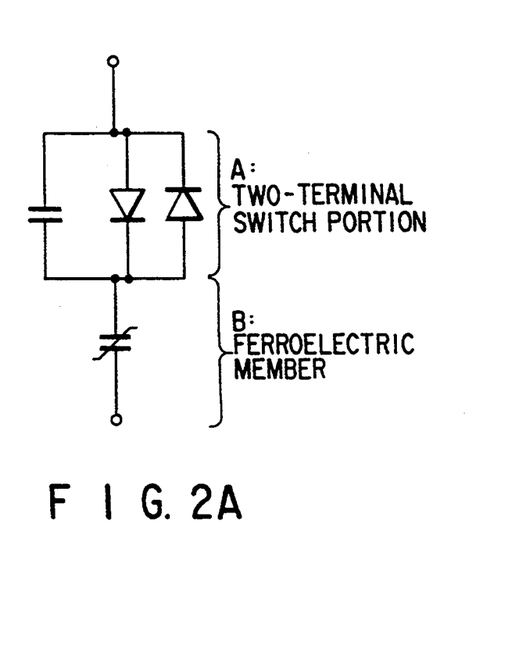
FIG. 2A is an equivalent circuit diagram of a memory cell.
Figure 2B:
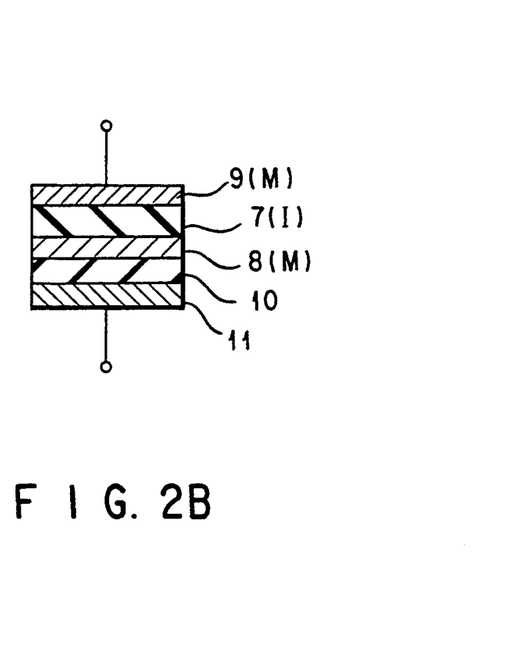
FIG. 2B is a sectional view showing the stacked structure of the memory cell.

FIG. 1 shows the arrangement of a ferroelectric memory device according to the first embodiment of the present invention. FIG. 2A is an equivalent circuit diagram of a memory cell. FIG. 2B shows the stacked structure of the memory cell.

The ferroelectric memory device of this embodiment comprises a memory cell section 1 in which memory cells (to be described later) are arranged in an n×n matrix, an X dummy cell circuit 2 having a common X-address dummy cell line, a Y dummy cell circuit 3 having a common Y-address dummy cell line, an X address section 4 for selecting a memory cell in/from which information is written/read, a Y address section 5, and a detection amplifier 6 for detecting a signal output from the X address section 4.

Each memory cell used for the memory cell section 1 is constituted by a two-terminal switching element section (MIM tunnel switching element) A, and a ferroelectric section (capacitor) B. The two-terminal switching element section A is designed such that an insulating film (tunnel film I) 7 is sandwiched between conductive films (M) 8 and 9, a ferroelectric member 10 is formed on the conductive film 8, and a conductive film 11 serving as an electrode is formed on the ferroelectric member 10. Each of the dummy cells constituting the dummy cell circuits has the same structure as that of each memory cell.

This ferroelectric memory cell (dummy cell) has such a stacked structure to realize a simple structure.

The principle of elimination of crosstalk components, which pose problems in, e.g., a reading operation, will be described below to explain an operation of the embodiment. In addition, an information loss which is caused when crosstalk components are eliminated by using an active matrix will be described below.

A case will be described below, in which part of the simple matrix arrangement shown in FIG. 17 is extracted, and a normal dielectric capacitor is used for a capacitor portion in the arrangement shown in FIG. 3.

Assume that two electrodes of the orthogonal electrodes constituting this simple matrix are arbitrarily selected, and a voltage is applied to the selected electrodes. For example, electrodes $X_2$ and $Y_2$ are selected, and a voltage V (V) is applied to the electrode $X_2$ while the electrode $Y_2$ is grounded, thus applying the voltage V (V) across a capacitor $C_{22}$.

At this time, the charge on the electrode $Y_2$ is observed. Since the electrodes $X_2$ and $Y_2$ are selected, and the voltage V is applied to the capacitor $C_{22}$, it is estimated that the amount of charge observed is given by $$Q = C_{22} \cdot V.$$

In practice, however, since the voltage is also applied to other intersections (e.g., capacitor $C_{12}$ and $C_{21}$) in the matrix, if the matrix is expressed by "$n \times n$", a voltage $V_C$ given by the following equation is applied to capacitors indicated by $C_{2,n(n \neq 2)}$ and $C_{n(n \neq 2),2}$, i.e., capacitors directly connected to one of the selected lines.

$$V_C = \frac{n-1}{2n-1} \cdot V(v) \tag{1}$$

Therefore, the above-mentioned amount of charge observed is not $$Q = C_{22} \cdot V$$

but is given as follows:

$$Q = C_{22} \cdot V + \Sigma C_{2,n(n \neq 2)} \cdot \frac{n-1}{2n-1} \cdot V + \tag{2}$$

$$\Sigma C_{n(n \neq 2),2} \cdot \frac{n-1}{2n-1} V$$

That is, the second and third terms of equation (2) correspond to crosstalk components so that in a reading operation, charges other than a selected charge are read. In contrast to this, in a writing operation, a voltage is applied to a non-selected memory cell to write data therein.

If a ferroelectric capacitor is used for the abovementioned capacitor portion, a similar phenomenon occurs to cause crosstalk. In this case, since the nonlinear characteristics of a ferroelectric member are dependent on an applied voltage, the amount of crosstalk is different from that in the case of a linear capacitor. As a method of measuring the amount of charge stored in the ferroelectric capacitor, a known method called a "Sawyer-Tower method" is available.

Figure 4:
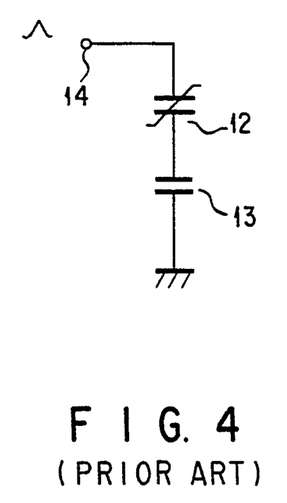
FIG. 4 is a circuit diagram showing the arrangement of a series circuit of a ferroelectric capacitor and a load capacitor.

In this measuring method, as shown in FIG. 4, a load capacitor 13 having a known capacitance is connected in series with a ferroelectric capacitor 12, and a charge amount is obtained from a voltage generated in the load capacitor 13.

Figure 5:
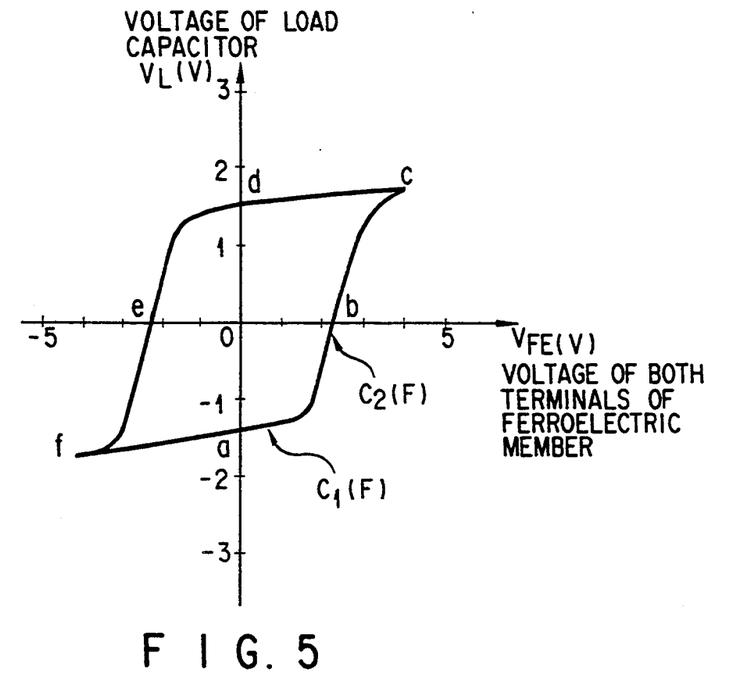
FIG. 5 is a graph showing hysteresis characteristics obtained when a triangular wave is applied to the circuit shown in FIG. 4.

FIG. 5 shows hysteresis characteristics obtained when a triangular wave is applied to an input terminal 14 of the circuit shown in FIG. 4. In FIG. 5, the voltage ($V_{FE}$) generated across the ferroelectric capacitor 12 is plotted along the abscissa; and the voltage ($V_L$) generated across the load capacitor 13, the ordinate.

The ferroelectric capacitor 12 is obtained by forming platinum (Pt) electrodes to sandwich a PZT film by an RF sputtering method. The ferroelectric capacitor 12 has an area of $1 \times 10^{-8}$ m$^2$. The capacitance of the load capacitor 13 is 200 pF. The peak voltage of the applied triangular wave is $V_p = \pm 10$ V. The repeating frequency is 5 Hz.

A charge $Q_L$ stored in the load capacitor 13 is calculated from a voltage $V_L$ of the load capacitor 13, plotted along the ordinate (FIG. 5), and a capacitance $C_L$ of the load capacitor 13. ($Q_L = V_L \cdot C_L$) is equal to a charge $Q_{FE}$ stored in the ferroelectric capacitor 12.

Therefore, the voltage $V_L$ plotted along the ordinate is proportional to the charge $Q_{FE}$ stored in the ferroelectric capacitor.

If a voltage is applied to the input terminal 14, and the maximum voltage applied across the ferroelectric member is represented by $V_p$, the following equation can be established:

$$Q_{FE} = \int_0^{V_p} C_{FE} \cdot dV_{FE} \tag{3}$$

Assume that the voltage $V_{FE}$ is increased in the positive direction from a point a ($V_{FE} = 0$ V, $V_L = -1.5$ V) to a point c. The charge $Q_{FE}$ stored in the ferroelectric capacitor exhibits a capacitance $C_1$ (F) near the point a; and a capacitance $C_2$ (F) near a point b ($V_{EF} = 2.5$ V to 3 V, $V_L = 0$ (V)). In this case, the capacitances $C_1$ and $C_2$ are represented by the slopes of the curve at the points a and b in FIG. 5. Since the slope at the point b is larger than that at the point a, the capacitance $C_2$ is larger than the capacitance $C_1$. This is because the charge $Q_{FE}$ changes upon ferroelectric polarization.

The voltage $V_{FE}$ is gradually decreased in the direction of 0 (V) from the point c. In this case, the charge $Q_{FE}$ exhibits the capacitance $C_1$ (F).

If the amount of change in the charge $Q_{FE}$ with a change in the voltage $V_{FE}$ from 0 (V) to $V_p$ (V) and D (V) is represented by $\Delta Q_{FE} \uparrow$, the following equation can be established:

$$\Delta Q_{FE} \uparrow = \int_0^{+V_p} C_{FE} \cdot dV_{FE} + \int_{+V_p}^0 C_{FE} \cdot dV_{FE} \tag{4}$$

In the ferroelectric capacitor, "0" is normally given by equation (4). That is, the value $\Delta Q_{FE} \uparrow$ is the amount of charge stored upon ferroelectric polarization.

Similarly, if the voltage $V_{FE}$ is negative, the value $\Delta Q_{FE} \downarrow$ is given as follows:

$$\Delta Q_{FE} \downarrow = \int_0^{-V_p} C_{FE} \cdot dV_{FE} + \int_{-V_p}^0 C_{FE} \cdot dV_{FE} \tag{5}$$

In addition, the following equation is established because of the symmetrical characteristics of the value $\Delta Q_{FE} \uparrow$ with respect to the hysteresis:

$$\Delta Q_{FE} \uparrow + \Delta Q_{FE} \uparrow = 0 \tag{6}$$

If the voltage $V_{FE}$ is applied to the ferroelectric member which has undergone a change in the voltage $V_{FE}$ from 0 (V) to $V_p$ (V) and 0 (V) once, while the voltage $V_{FE}$ is changed from 0 (V) to $V_p$ (V) and 0 (V) again, the value $\Delta Q_{FE} \uparrow$ is given as follows:

$$\Delta Q_{FE} \uparrow' = \int_0^{V_p} C_{FE} \cdot dV_{FE} + \int_{V_p}^0 C_{FE} \cdot dV_{FE} = 0 \tag{7}$$

Similarly, if a negative potential is applied to the ferroelectric member, the following equation is established:

$$\Delta Q_{FE} \downarrow' = \int_{0}^{-V_P} C_{FE} \cdot dV_{FE} + \int_{-V_P}^{0} C_{FE} \cdot dV_{FE} = 0 \quad (8)$$

This is because the ferroelectric member which has undergone ferroelectric polarization once behaves like a general dielectric member upon application of a potential having the same polarity and magnitude as those of the previously applied voltage.

In general, a ferroelectric member is used for a destructive read type memory, and "1" and "0" are set on the basis of the difference between equations (4) and (1) or equations (5) and (8).

Consider ferroelectric polarization with a change in the voltage $V_{FE}$ from 0 (V) to $\frac{1}{2} \cdot V_p$ (V) and 0 (V). In this case, the following equation is established:

$$\Delta Q_{FE} \uparrow = \int_{0}^{\frac{1}{2} V_P} C_{FE} \cdot dV_{FE} + \int_{\frac{1}{2} V_P}^{0} C_{FE} \cdot dV_{FE} \quad (9)$$

Subsequently, the voltage $V_{FE}$ is applied to the ferroelectric member which has undergone the above change in voltage, with a change in the voltage from 0 (V) to $V_p$ (V) and 0 (V). The following equation is then established:

$$\Delta Q_{FE} \uparrow'' = \int_{0}^{\frac{1}{2} V_P} C_{FE} \cdot dV_{FE} + \int_{\frac{1}{2} V_P}^{V_P} C_{FE} \cdot dV_{FE} + \int_{V_P}^{\frac{1}{2} V_P} C_{FE} \cdot dV_{FE} + \int_{\frac{1}{2} V_P}^{0} C_{FE} \cdot dV_{FE} \quad (10)$$

The sum of the first and fourth terms of equation (10) is "0". That is, the magnitude of ferroelectric polarization is determined by the second and third terms. The reason for this is the same as that described with reference to equation (8).

Figure 6:
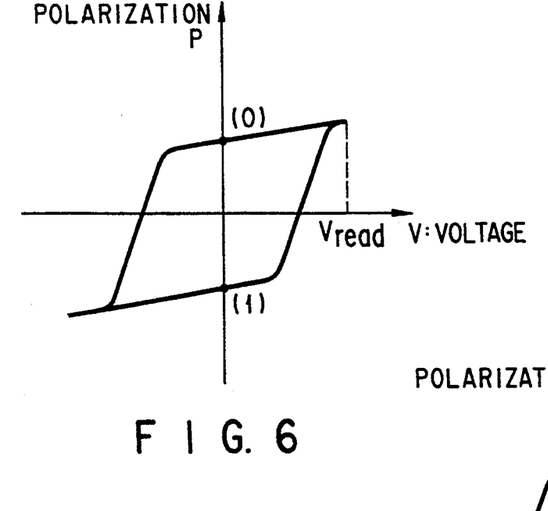
FIG. 6 is a graph showing the normal hysteresis characteristics of a ferroelectric member.
Figure 7:
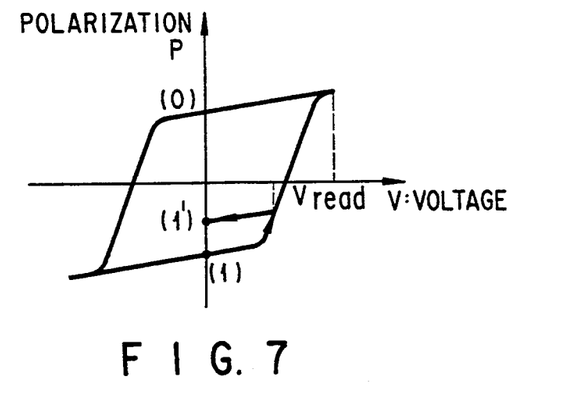
FIG. 7 is a graph showing the hysteresis characteristics obtained when a predetermined voltage is applied to the ferroelectric member.
Figure 8:
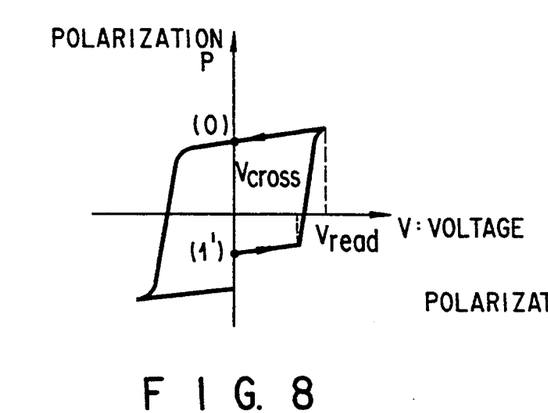
FIG. 8 is a graph showing hysteresis characteristics obtained when a readout voltage is applied to the ferroelectric member, after the predetermined voltage is applied to the ferroelectric member.

Driving of a simple matrix memory using the characteristics of a ferroelectric member will be described next with reference to FIGS. 6 to 9. FIG. 6 shows the normal hysteresis characteristics of the ferroelectric member. FIG. 8 shows hysteresis characteristics obtained when a voltage is applied to the ferroelectric member.

In the simple matrix memory, since a voltage is applied to portions other than a selected memory cell, as described above, not only the ferroelectric polarization component of a target cell but also the ferroelectric polarization components of other cells are read in a reading operation.

For this reason, if the matrix is increased in size, and polarization due to crosstalk is increased in magnitude, the ferroelectric polarization component of the target cell cannot be discriminated.

In this case, if the characteristics expressed by equations (9) and (10) are used, the ferroelectric polarization components of cells other the target cell, i.e., the ferroelectric polarization components of cells which may cause crosstalk, can be eliminated.

More specifically, assume that the distributed voltage of a cell which causes crosstalk when the charge of a selected cell is read at a voltage $V_{read}$ (V) is represented by $V_{cross}$ (V). A voltage which is higher than the voltage $V_{cross}$ and has the same polarity as that thereof is applied to the respective cells (the selected cell may or may not be included) in advance. That is, the polarization shifts from (1) to (1') in FIG. 7. Upon application of this voltage, the amount of charge from the target cell is $Q_{FE} \uparrow$ (Real), and the crosstalk component is $Q_{FE} \uparrow$ (-cross). According to the relationship between equations (9) and (10) ($V_{read} > V_{cross}$), $$Q_{FE} \uparrow (\text{Real}) = \int_{0}^{V_{read}} C_{FE} \cdot dV_{FE} + \int_{V_{read}}^{0} C_{FE} \cdot dV_{FE} \quad (11)$$

When the voltage $V_{cross}$ (V) is applied to the cell, the polarization shifts from (1') to (0) in FIG. 8.

If the voltage $V_{cross}$ (V) is not applied to the cell, the polarization shifts from (1) to (0) in FIG. 6.

$$Q_{FE} \uparrow (\text{cross}) = \int_{0}^{V_{cross}} C_{FE} \cdot dV_{FE} + \int_{V_{cross}}^{0} C_{FE} \cdot dV_{FE} \quad (12)$$

Figure 9:
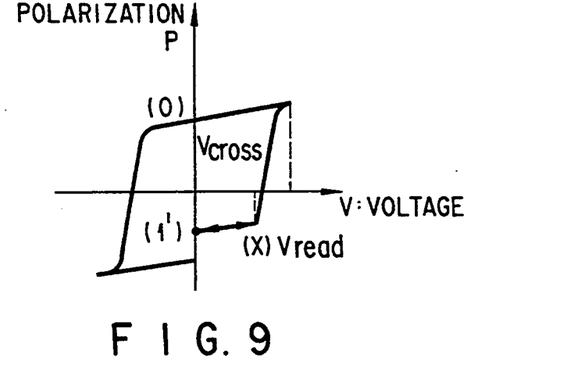
FIG. 9 is a graph showing hysteresis characteristics obtained when a voltage corresponding to the crosstalk voltage is applied to the ferroelectric member, after the predetermined voltage is applied to the ferroelectric member.

As shown in FIG. 9, the polarization shifts from (1') to (X) and (1').

As is apparent from equations (11) and (12), the ferroelectric polarization due to crosstalk in the read mode becomes "0", and only the charge generated by the ferroelectric polarization of the selected cell can be extracted.

In addition, as shown in FIG. 9, since polarization P shifts from (1') to (X) and (1'), no ferroelectric polarization occurs.

If a predetermined voltage is applied to the respective cells beforehand in this manner, crosstalk can be eliminated. However, a shift in polarization from (1) to (1') in FIG. 7 indicates that information read out from this cell is reduced in amount.

A method of ensuring information by reducing the amount of shift from (1) to (1') will be described next.

Figure 10:
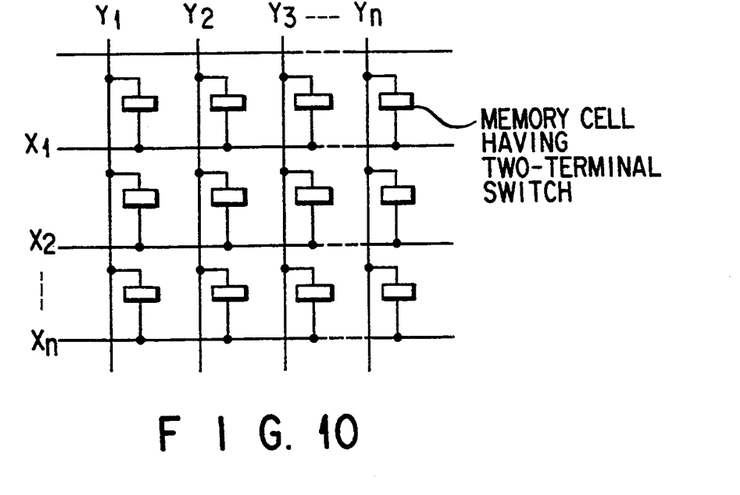
FIG. 10 is a circuit diagram showing a matrix arrangement obtained by replacing the memory cell portions of the simple matrix with memory cells having two-terminal switches.

FIG. 10 shows a matrix arrangement obtained by replacing each memory cell portion of the above-described simple matrix memory constituted by only ferroelectric capacitors with a memory cell having a two-terminal switch, i.e., the memory cell shown in FIGS. 2A and 2B, which is constituted by a series circuit of a two-terminal switch and a ferroelectric capacitor. A driving method in this matrix arrangement is the same as that in the simple matrix described above.

Figure 11:
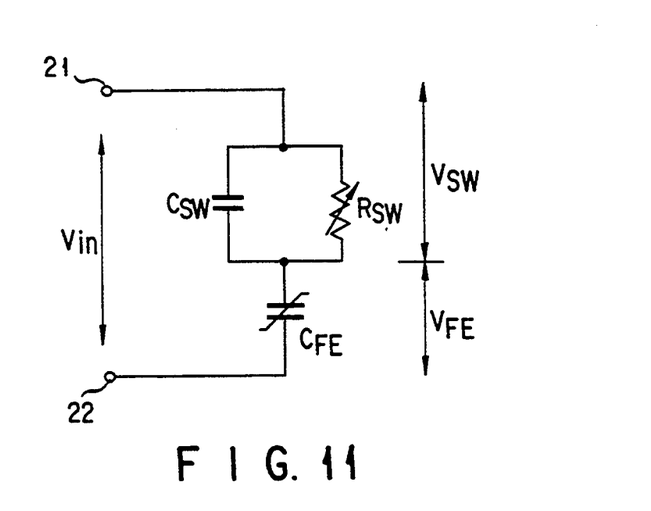
FIG. 11 is a circuit diagram showing the arrangement of a memory cell having a two-terminal switch.

That is, consider only a case wherein a read voltage $V_{read}$ (V) is applied to terminals 21 and 22 of the memory cell shown in FIG. 11, and a case wherein a crosstalk voltage (about $\frac{1}{2}$ the voltage $V_{read}$) is applied to the terminals 21 and 22.

Figure 12:
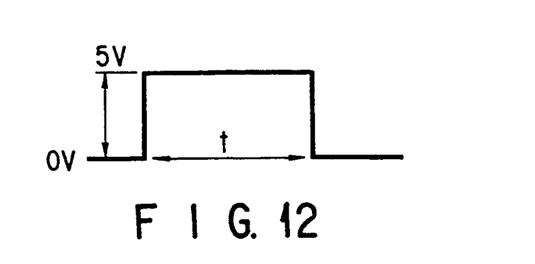
FIG. 12 is a view showing a rectangular wave applied to a memory cell having a two-terminal switch.
Figure 13:
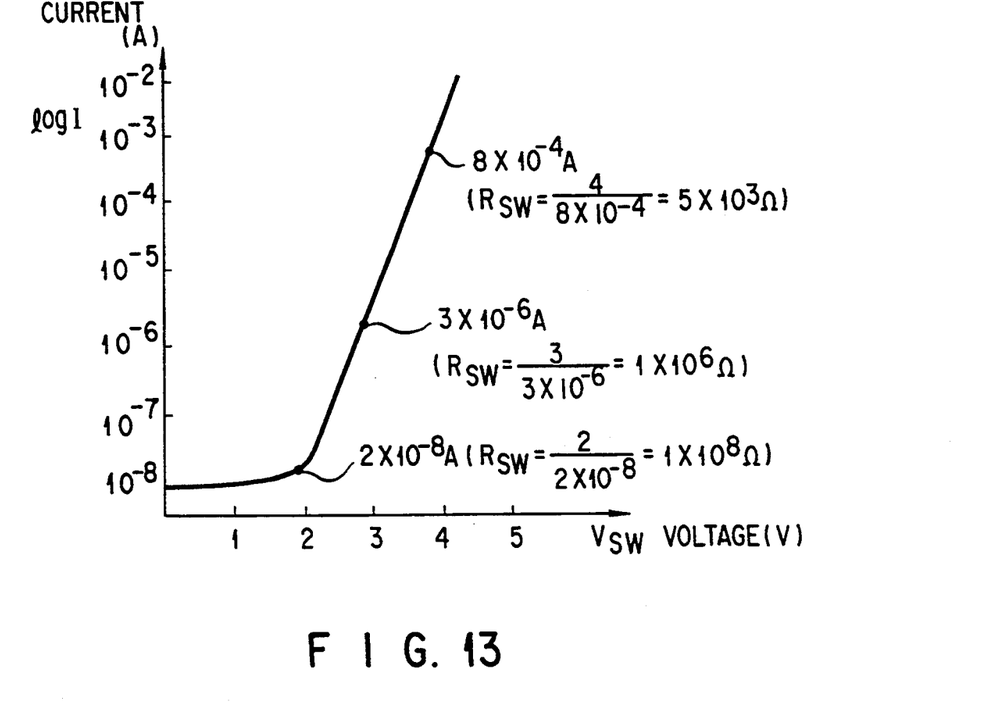
FIG. 13 is a graph showing the voltage/current characteristics of a two-terminal switch according to the first embodiment.
Figure 14:
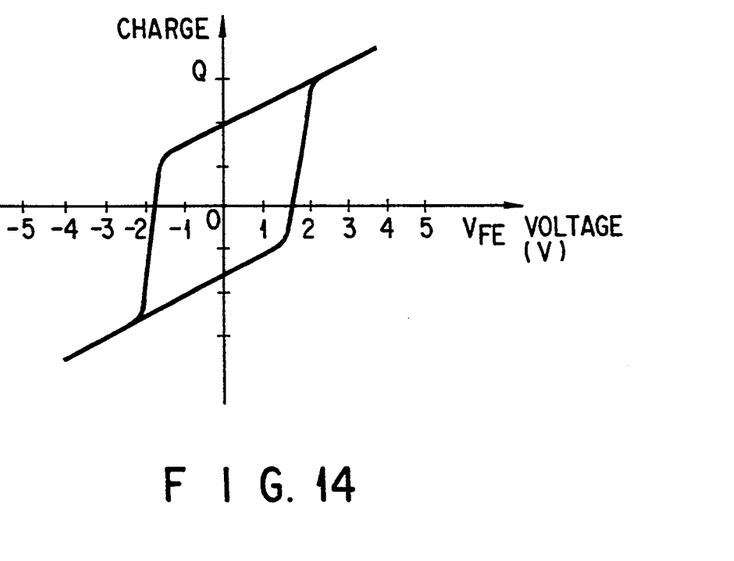
FIG. 14 is a graph showing the hysteresis characteristics of the ferroelectric capacitor according to the first embodiment.
Figure 15:
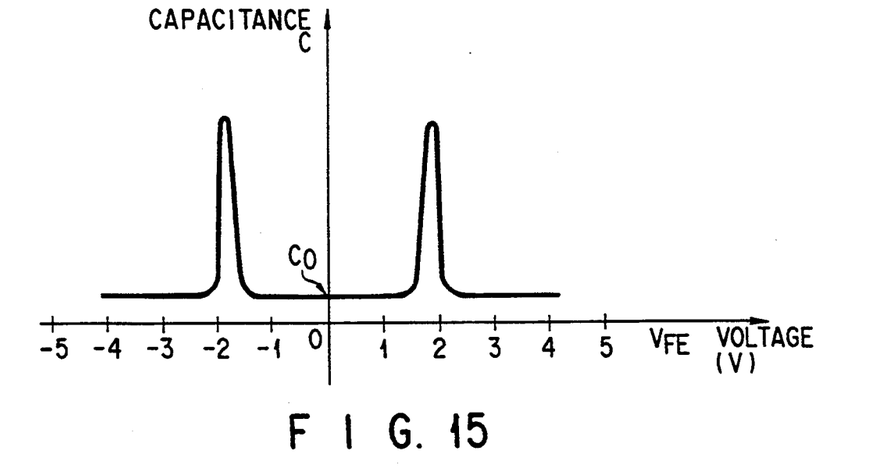
FIG. 15 is a graph showing the voltage/capacitance characteristics of the ferroelectric capacitor according to the first embodiment.

Assume that the rectangular wave shown in FIG. 12 is applied to the memory cell in FIG. 11, and that the two-terminal switch has the electrical characteristic shown in FIG. 13; and the ferroelectric capacitor has the electrical characteristics shown in FIGS. 14 and 15.

When a pulse rises from 0 V to 5 V, a charging current flows into a capacitor $C_0$ (see FIG. 14) as liner components of parasitic and stray capacitance components $C_{SW}$ and $C_{FE}$ of the two-terminal switch, and the memory cell has potentials $V_{SW}$ and $V_{FE}$ distributed in the reciprocal ratio of $C_{SW}$ to $C_0$. A charge $Q_I$ which shifts upon this charging operation is given by $Q_1 = V_{SW} \cdot C_{SW} = V_{FE} \cdot C_0$.

At this time, the potential $V_{FE}$ is set to be a value at which no ferroelectric polarization occurs. In this case, consider that charging is performed to set $V_{FE}=1$ V and $V_{SW}=4$ V.

Subsequently, the potential $V_{FE}$ is increased because of a charge $Q_{SW}$ flowing from a resistive element $R_{SW}$. Assume that the potential $V_{FE}$ has reached 2 V after a lapse of a predetermined period of time.

As is apparent from FIG. 14, when a voltage of 2 V is applied to the ferroelectric member, the ferroelectric polarization is completely reversed (the resistance of the resistive element RSW changes from $5 \times 10^3 \Omega$ to $1 \times 10^6 \Omega$, as shown in FIG. 13).

The input pulse then changes from 5 V to 0 V. With this change, a charge equal to the stored charge is discharged.

$$Q_{FE} = \int_0^1 C_0 \cdot dV_{FE} + \int_1^2 C_{FE} \cdot dV_{FE} + \int_2^1 C_0 \cdot dV_{FE} = \int_1^2 C_{FE} \cdot dV_{FE} = Q_{SW} \quad (13)$$

Consider a crosstalk component next. Since a voltage $\frac{1}{2}V_{in}$ is applied to a crosstalk cell portion, as described above, a rectangular pulse having a peak value of 2.5 V will be considered here.

When the pulse rises, the crosstalk cell portion is charged to have $V_{FE\text{-}CROSS}=0.5$ V and $V_{SW\text{-}CROSS}=2$ V. Thereafter, a capacitor $C_{FE}$ is charged by $R_{SW\text{-}CROSS}$ determined by the magnitude of $V_{FE\text{-}CROSS}$, and a change in $V_{FE\text{-}CROSS}$ occurs.

In this case, as is apparent from FIG. 12, when $V_{SW}=2$ V, $R_{SW\text{-}CROSS}$ is $1 \times 10^8 \Omega$, and a charge $C_{SW\text{-}CROSS}$ flowing into the capacitor $C_{FE}$ in a time interval t is 1/100 or less the above-mentioned charge $Q_{SW}(R_{SW}(<10^6 \Omega): R_{SW\text{-}CROSS}(>10^8 \Omega)=1:100)$ If, therefore, a memory cell is driven so as to eliminate crosstalk in a reading operation by applying a voltage in advance using a two-terminal switch incorporated in the system, a ferroelectric polarization loss can be minimized. As a result, the S/N ratio in the read mode is greatly increased.

A reading operation of the above-described ferroelectric memory device of the present invention will be described below with reference to FIGS. 1 to 2B.

Assume that information is read out from a memory cell $C_{11}$.

Before a reading operation, electrodes $X_1$ and $Y_D$ are selected, and a pulse identical to a read pulse is applied through a terminal $V_{in}$. As a result, a crosstalk voltage $$\frac{n-1}{2n-1} \cdot V_{in}$$

is applied to memory cells $C_{1,n(n=1,\ldots,n)}$, thus pre-processing the memory cells selected through the $X_1$ line.

Subsequently, electrodes $X_D$ and $Y_1$ are selected, and the same operation is performed to apply a crosstalk voltage $$\frac{n-1}{2n-1} \cdot V_{in}$$

to memory cells $C_{n(n=1,\ldots,n),1}$, thus pre-processing the memory cells selected through the $Y_1$ line.

With this operation, the processing of the crosstalk portions, which pose problems when information is read out from the memory cell $C_{11}$, is completed.

At this time, the electrodes $X_1$ and $Y_1$ are addressed to perform a reading operation with respect to the memory cell $C_{11}$. A read pulse is applied through the terminal $V_{in}$, and determination of "1"/"0" is performed by the detection amplifier 6. With this operation, only an information charge can be read from the memory cell $C_{11}$ without causing crosstalk.

As described above, in the ferroelectric memory device according to the first embodiment of the present invention, when a reading operation is to be performed with respect to each memory cell, a predetermined voltage is applied to memory cells other than a target memory cell in advance to cause ferroelectric polarization corresponding to crosstalk components, thus preventing crosstalk. In addition, since the ferroelectric polarization corresponding to the crosstalk components, which are eliminated by the voltage applied in advance, actually corresponds to a portion of information stored in each memory cell, the amount of polarization caused upon application of the voltage is small. Therefore, recorded data is not influenced much.

Note that the above-described crosstalk eliminating operation can be applied to the write mode in the same manner as described above.

Therefore, by attaching a nonlinear two-terminal switch to a ferroelectric memory cell, a memory cell arrangement can be realized, which can reduce ferroelectric polarization caused upon elimination of crosstalk components.

In addition, the ferroelectric memory device of the first embodiment can prevent crosstalk, which is a drawback in the simple matrix scheme, and can realize a high-density memory device having a high S/N ratio because the device has a stacked structure.

The present invention is not limited to the abovedescribed embodiment. For example, the two-terminal switching element section A may be constituted by a bidirectional diode BDD shown in FIG. 2A in place of the MIM switching element. Various changes and modifications can be made within the spirit and scope of the invention.

As has been described in detail above, according to the first embodiment of the present invention, there is provided a ferroelectric memory device constituted by a matrix of ferroelectric memory cells, each having a two-terminal switch to realize a simple structure, in which a reading/writing operation is performed after a predetermined voltage is applied to memory cells other than a target cell to cause ferroelectric polarization corresponding to crosstalk components, thereby preventing crosstalk.

Figure 16:
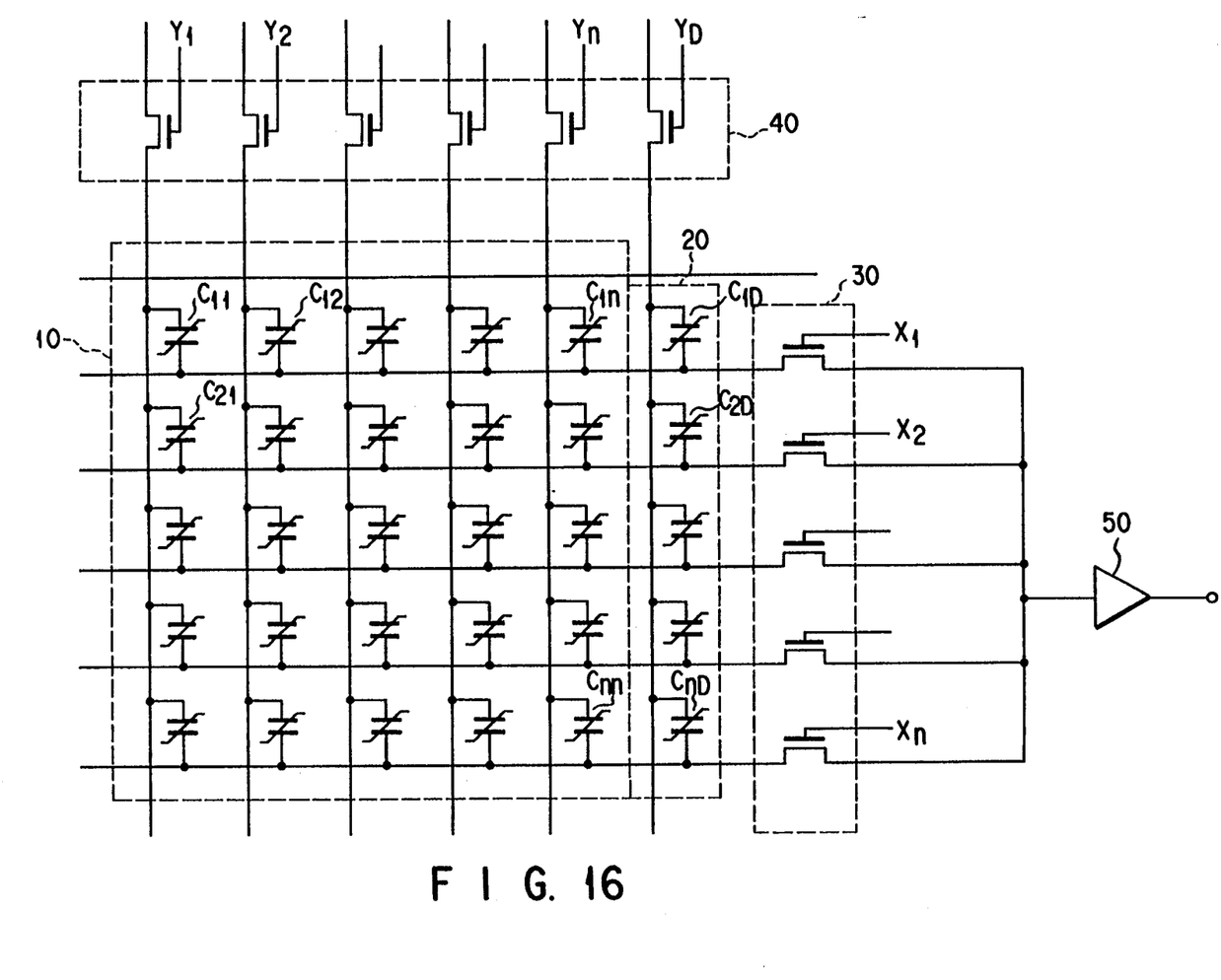
FIG. 16 is a circuit diagram showing the arrangement of a ferroelectric memory device according to the second embodiment of the present invention.

FIG. 16 shows the arrangement of the second embodiment of the present invention. A ferroelectric memory device of this embodiment comprises a memory cell section 10 constituted by an $n \times n$ simple matrix circuit, and a dummy cell section 20 having memory cells and a common X-address dummy cell line. The respective X and Y lines are connected to an X address section 30 and a Y address section 40 having corresponding address selection switches. A detection amplifier 50 is commonly connected to the X lines.

Assume that a charge is read from a memory cell $C_{11}$ in the ferroelectric memory device having the abovedescribed arrangement.

(1) Addresses $X_1$ and $Y_D$ are selected, and a read voltage is applied. As a result, a crosstalk voltage is applied to memory cells $C_{11}$ to $C_{1n}$ to cause ferroelectric polarization corresponding to crosstalk components. Addresses $X_2$ and $Y_D$ are selected next, and the same operation is performed. This process is repeated up to addresses $X_n$ and $Y_D$, thus causing ferroelectric polarization corresponding to all the crosstalk components.

(2) The addresses $X_1$ and $Y_1$ are selected, and a reading operation is performed. As a result, only a charge generated by ferroelectric polarization in the memory cell $C_{11}$ is detected by the detection amplifier 50.

(3) Since a destructive read method is used, polarization may be destructed depending on its direction. Therefore, when destructed, polarization must be rewritten. In a rewrite operation (e.g., with respect to the memory cell $C_{11}$), the addresses $X_1$ and $Y_D$ are selected, and a read voltage must be applied.

When a reading operation is to be continuously performed with respect to another memory cell, the operation (1) need not be performed, but only the operation (3) needs to be performed after the reading operation (2).

The third embodiment of the present invention will be described below. A circuit of this embodiment is constituted by the basic, simple matrix shown in FIG. 3.

When a reading operation of this ferroelectric memory device is to be performed, a writing operation is performed with respect to all the cells by using an arbitrary uniform voltage having the same polarity as that of a read voltage and a magnitude almost equal to that of a crosstalk voltage. Thereafter, a normal addressing operation is performed to read a charge from a target cell, thereby performing a reading operation without causing crosstalk.

Furthermore, by arranging several memory circuits identical to the memory circuits of the second and third embodiments, as basic units, to form a memory device, the time required to cause polarization corresponding to crosstalk components can be shortened.

As described above, by applying a voltage which is higher than the voltage $V_{cross}$ and has the same polarity as that thereof to each cell (a selected cell may or may not be included) in advance, a charge generated by ferroelectric polarization in the selected cell can be extracted. Since crosstalk, which is a drawback in the simple matrix scheme, can be prevented, a high-density memory having a high S/N ratio can be realized.

As has been described in detail above, according to the second and third embodiments of the present invention, there is provided a ferroelectric memory device which can prevent crosstalk, has a S/N ratio, and can realize a high integration density.

Note that a crosstalk preventing effect can also be obtained by using any one of the following elements as each memory cell portion of the matrix memory in place of the above-described ferroelectric memory member or an element constituted by an MIM tunnel switch and a ferroelectric memory member: an element formed by stacking a ferroelectric member and a counterferroelectric layer on each other, as disclosed in Published Unexamined Japanese Patent Application No. 3-108192; an element formed by stacking a ferroelectric layer and a dielectric layer on each other, as disclosed in Published Unexamined Japanese Patent Application No. 3-108769; and an element formed by stacking a ferroelectric layer and an oxide varistor layer on each other, as disclosed in Published Unexamined Japanese Patent Application No. 4-18753.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A ferroelectric memory device comprising:
   a matrix memory cell array comprising a plurality of belt-like first conductive members, a plurality of belt-like second conductive members arranged in a direction perpendicular to said first conductive members, respectively, and ferroelectric capacitors formed at nodes of said first conductive members and said second conductive members, respectively;
   precedent voltage-applying means for applying a non-zero voltage with the same polarity as that of a reading/writing voltage, to said matrix memory cell array, prior to a reading/writing operation; and
   means for subsequently executing the reading/writing operation with respect to an addressed memory cell of said matrix memory cell array following the precedent voltage-application of said precedent voltage-applying means.

2. A ferroelectric memory device according to claim 1, wherein said precedent voltage-applying means applies a predetermined non-zero voltage to memory cells other than the addressed memory cell prior to the reading/writing operation.

3. A ferroelectric memory device according to claim 1, wherein said precedent voltage-applying means applies a predetermined non-zero voltage to all memory cells of said matrix memory cell array prior to the reading/writing operation.

4. A ferroelectric memory device according to claim 1, wherein said precedent voltage-applying means includes a dummy cell with ferroelectric characteristics.

5. A ferroelectric memory device according to claim 4, wherein said dummy cell is formed of a dielectric member.

6. A ferroelectric memory device according to claim 1, wherein said precedent voltage-applying means includes power supply means for applying a predetermined voltage to each memory cell of said matrix memory cell array.

7. A ferroelectric memory device according to claim 1, wherein said precedent voltage-applying means applies a voltage with a value at least equal to that of a crosstalk voltage, to each memory cell of said matrix memory cell array.

8. A ferroelectric memory device according to claim 1, wherein each memory cell of said matrix memory cell array has a two-terminal switch section connected in series to said ferroelectric capacitor.

9. A ferroelectric memory device according to claim 8, wherein said two-terminal switch section comprises an MIM tunnel switching element which exhibits a bipolarity and is of a three-layer structure fabricated by a metal (M), an insulation (I), and another metal (M), said ferroelectric capacitor comprising a ferroelectric member stacked on one of the two metals (M) of said MIM tunnel switching element.

10. A ferroelectric memory device according to claim 8, wherein said two-terminal switch section includes a bidirectional diode.

11. A method for executing a reading/writing operation in a ferroelectric memory device, said method comprising the steps of:

preparing a matrix memory cell array in which a plurality of belt-like first conductive members, a plurality of belt-like second conductive members and ferroelectric capacitors are arranged in a matrix manner, said second conductive members being arranged in a direction perpendicular to said first conductive members, respectively, and said ferroelectric capacitors being formed at nodes of said first conductive members and said second conductive members, respectively;

precedently-applying a non-zero voltage with the same polarity as that of a reading/writing voltage to said matrix memory cell array prior to a reading/writing operation; and subsequently executing the reading/writing operation for an addressed memory cell of said matrix memory cell array following said precedent voltage-applying step.

12. A method according to claim 11, wherein said precedent voltage-applying step is performed for memory cells other than the addressed memory cell to be accessed in the reading/writing operation.

13. A method according to claim 11, wherein said precedent voltage-applying step is performed for all memory cells of said matrix memory cell array.

14. A method according to claim 11, wherein the voltage of said precedent voltage-applying step is a predetermined voltage having a value at least equal to that of a crosstalk voltage.

* * * * *